(12) United States Patent
Tsunemi et al.

(10) Patent No.: US 12,353,253 B2
(45) Date of Patent: Jul. 8, 2025

(54) ELECTRONIC DEVICE

(71) Applicant: Panasonic Intellectual Property Management Co., Ltd., Osaka (JP)

(72) Inventors: Satoshi Tsunemi, Osaka (JP); Ryusuke Teramoto, Osaka (JP); Takeshi Mori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 170 days.

(21) Appl. No.: 18/227,936

(22) Filed: Jul. 30, 2023

(65) Prior Publication Data

US 2023/0376081 A1 Nov. 23, 2023

Related U.S. Application Data

(63) Continuation of application No. PCT/JP2021/046471, filed on Dec. 16, 2021.

(30) Foreign Application Priority Data

Feb. 26, 2021 (JP) .................. 2021-029425

(51) Int. Cl.
*G06F 1/16* (2006.01)
*E05B 65/00* (2006.01)
*H05K 5/02* (2006.01)

(52) U.S. Cl.
CPC ........ *G06F 1/1679* (2013.01); *E05B 65/0067* (2013.01); *G06F 1/1601* (2013.01);
(Continued)

(58) Field of Classification Search
CPC .... G06F 1/1601; G06F 1/1616; G06F 1/1654; G06F 1/1681; G06F 1/1679; G06F 1/1669; G06F 1/1632; E05B 65/0067
See application file for complete search history.

(56) References Cited

U.S. PATENT DOCUMENTS 5,465,191 A * 11/1995 Nomura ............... H05K 5/0221
361/740
5,580,107 A * 12/1996 Howell .................... E05C 5/00
292/125
(Continued)

FOREIGN PATENT DOCUMENTS

JP H11-210298 A 8/1999
JP 2001-015943 A 1/2001
(Continued)

OTHER PUBLICATIONS

International Search Report for related Application No. PCT/JP2021/046471, mailed Feb. 15, 2022.

*Primary Examiner* — Rockshana D Chowdhury
*Assistant Examiner* — Martin Antonio Asmat Uceda
(74) *Attorney, Agent, or Firm* — Renner, Otto, Boisselle & Sklar, LLP

(57) ABSTRACT

The electronic device includes a first unit, a second unit, and a latch mechanism part. A latch mechanism part includes a latch member, a housing recess, an urging member, and a first groove portion. The latch member includes a shaft portion extending and urged in a direction intersecting a second side surface, a connection part extending from the shaft portion, and a protrusion provided on the connection part. The latch member is rotatably attached to the second unit. The first groove portion is provided on a first side surface and houses the protrusion of the latch member located at the restriction position. The protrusion includes a first inclined surface inclined in a direction approaching the first side surface with increasing distance from the second unit in the rotation direction of the latch member.

7 Claims, 5 Drawing Sheets

(52) U.S. Cl.
CPC .......... *G06F 1/1616* (2013.01); *G06F 1/1643* (2013.01); *G06F 1/1656* (2013.01); *G06F 1/1654* (2013.01); *G06F 1/1681* (2013.01); *H05K 5/02* (2013.01)

(56) References Cited

U.S. PATENT DOCUMENTS

| | | | | |
|---|---|---|---|---|
| 5,676,408 | A * | 10/1997 | Davidian | E05B 65/0811 292/197 |
| 6,123,373 | A | 9/2000 | Yoshida | |
| 6,125,040 | A * | 9/2000 | Nobuchi | E05B 63/14 312/223.1 |
| 6,256,194 | B1 * | 7/2001 | Choi | G06F 1/1679 70/159 |
| 6,266,235 | B1 * | 7/2001 | Leman | G06F 1/1616 361/679.55 |
| 6,310,766 | B1 * | 10/2001 | Bae | E05C 3/14 292/18 |
| 6,517,129 | B1 * | 2/2003 | Chien | E05B 63/248 361/679.55 |
| 6,965,512 | B2 * | 11/2005 | Huang | G06F 1/1679 361/679.55 |
| 11,360,521 | B2 * | 6/2022 | Kuo | G06F 1/1679 |
| 2003/0223190 | A1 * | 12/2003 | Hashimoto | G06F 1/162 361/679.01 |
| 2005/0135070 | A1 * | 6/2005 | Hsu | G06F 1/1679 361/732 |
| 2005/0276010 | A1 * | 12/2005 | Song | G06F 1/1616 361/679.06 |
| 2005/0286215 | A1 * | 12/2005 | Yang | G06F 1/1616 361/679.55 |
| 2006/0133019 | A1 * | 6/2006 | Yamazaki | G06F 1/1679 361/679.21 |
| 2008/0179894 | A1 * | 7/2008 | Chuang | G06F 1/1616 292/109 |
| 2012/0243197 | A1 * | 9/2012 | Cheng | G06F 1/1679 16/250 |
| 2012/0250230 | A1 * | 10/2012 | Lin | G06F 1/1679 361/679.01 |
| 2014/0312628 | A1 * | 10/2014 | Yuan | E05C 3/124 292/99 |
| 2017/0163827 | A1 | 6/2017 | Higuchi et al. | |
| 2019/0352936 | A1 * | 11/2019 | Chou | E05B 65/0067 |

FOREIGN PATENT DOCUMENTS

| | | | |
|---|---|---|---|
| JP | 2005-015493 A | 1/2005 | |
| JP | 2005-129770 A | 5/2005 | |
| JP | 2017-107016 A | 6/2017 | |
| WO | 1993/006866 A2 | 4/1993 | |
| WO | WO-2017077667 A1 * | 5/2017 | .......... E05B 65/0067 |
| WO | WO-2018155363 A1 * | 8/2018 | ............ E05B 63/24 |

* cited by examiner

ELECTRONIC DEVICE

TECHNICAL FIELD

The present disclosure relates to an electronic device.

BACKGROUND ART

PTL 1 discloses a joining structure for detachably joining units. In this joining structure, a rotation lever is rotatably provided in one unit. The rotation lever and the other unit are respectively provided with an engaging portion and an engaged portion that are engaged with each other at a lock position of the rotation lever and are disengaged from each other at a position other than the lock position. The other unit is pressed by the rotation lever and separated from the one unit by the rotation lever being rotated in one direction from the lock position.

CITATION LIST

Patent Literature

PTL 1: Unexamined Japanese Patent Publication No. 2001-15943

SUMMARY OF THE INVENTION

An object of the present disclosure is to provide an electronic device capable of more easily releasing the retaining of a closed state of a first unit with respect to a second unit.

An electronic device according to one aspect of the present disclosure includes: a first unit having a first main surface, a second main surface opposite to the first main surface in a direction intersecting the first main surface, and a first side surface intersecting the first main surface and the second main surface; a second unit having a third main surface, a fourth main surface opposite to the third main surface in a first direction intersecting the third main surface, and a second side surface intersecting the third main surface and the fourth main surface, the first unit being rotatably connected to the second unit, and the second side surface being disposed along the same plane as the first side surface in a closed state where the second main surface and the third main surface approach and face each other in the first direction; and a latch mechanism part configured to retain the first unit in the closed state with respect to the second unit.

The latch mechanism part includes: a latch member that includes a shaft portion extending along a rotation axis extending in a second direction intersecting the second side surface, a connection part extending from the shaft portion in a radial direction of the rotation axis, and a protrusion provided at a distal end of the connection part on a side farther from the shaft portion in the radial direction, the latch member being attached to the second unit in a state where the protrusion is rotatable about the rotation axis between a restriction position where the protrusion faces the first side surface in the second direction and a release position where the protrusion faces the second side surface in the second direction; a housing recess that is provided on the second side surface and houses the shaft portion; an urging member that is disposed in the housing recess and urges the latch member toward an inside of the first unit; and a first groove portion that is provided on the first side surface and houses the protrusion when the latch member is located at the restriction position.

The protrusion has a first inclined surface provided at a first end close to the second unit in a rotation direction of the latch member when the latch member is located at the restriction position, and the first inclined surface is inclined in a direction approaching the first side surface with increasing distance from the second unit in the rotation direction.

According to the present disclosure, it is possible to realize the electronic device capable of more easily releasing the retaining of the closed state of the first unit with respect to the second unit.

DESCRIPTION OF EMBODIMENT

Background to Present Disclosure

Figure 1:
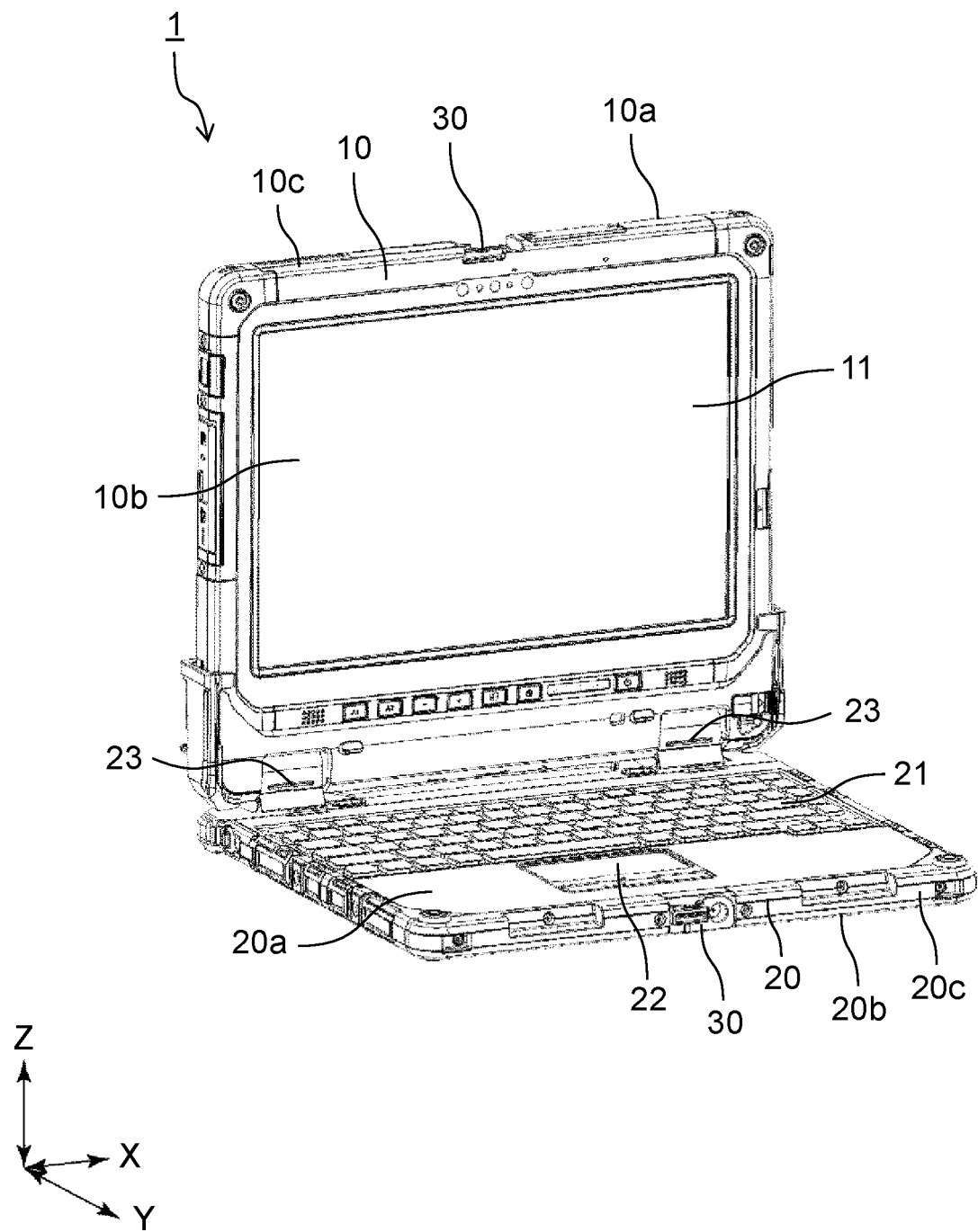
FIG. 1 is a schematic perspective view illustrating an electronic device according to an exemplary embodiment of the present disclosure.

In the joining structure of PTL 1, the rotation lever is housed in a cutout at a lock position. For this reason, when the joining of both units is released, it is necessary to rotate the rotation lever after pulling up the rotation lever upward, which may take time and effort.

The present inventors have devised an electronic device capable of more easily releasing the retaining of the closed state of the first unit with respect to the second unit, and have reached the present disclosure.

An electronic device according to a first aspect of the present disclosure includes: a first unit having a first main surface, a second main surface opposite to the first main surface in a direction intersecting the first main surface, and a first side surface intersecting the first main surface and the second main surface; a second unit having a third main surface, a fourth main surface opposite to the third main surface in a first direction intersecting the third main surface, and a second side surface intersecting the third main surface and the fourth main surface, the first unit being rotatably connected to the second unit, and the second side surface being disposed along the same plane as the first side surface in a closed state where the second main surface and the third main surface approach and face each other in the first direction; a latch mechanism part capable of retaining the first unit in the closed state with respect to the second unit; in which the latch mechanism part includes a latch member including a shaft portion extending along a rotation axis extending in a second direction intersecting the second side surface, a connection part extending from the shaft portion in a radial direction of the rotation axis, and a protrusion provided at a distal end of the connection part on a side farther from the shaft portion in the radial direction, the latch member being attached to the second unit in a state where the protrusion is rotatable about the rotation axis between a restriction position where the protrusion faces the first side surface in the second direction and a release position where the protrusion faces the second side surface in the second direction, a housing recess that is provided on the second side surface and houses the shaft portion; and an urging member that is disposed in the housing recess and urges the latch member toward the inside of the first unit in the second direction, and a first groove portion that is provided on the first side surface and houses the protrusion when the latch member is located at the restriction position, the protrusion including a first inclined surface provided at an end close to the second unit in a rotation direction of the latch member when the latch member is located at the restriction position, and the first inclined surface being inclined in the second direction and in a direction approaching the first side surface with increasing distance from the second unit in the rotation direction.

According to the electronic device of the first aspect, it is possible to realize the electronic device capable of more easily releasing the retaining of the closed state of the first unit with respect to the second unit.

In an electronic device according to a second aspect of the present disclosure, the first groove portion has a second inclined surface provided at an end close to the second unit in the rotation direction, and the second inclined surface is inclined in the second direction and in a direction away from the first side surface with increasing distance from the second unit in the rotation direction.

According to the electronic device of the second aspect, the latch member located at the restriction position can be more easily rotated toward the release position.

In the electronic device according to a third aspect of the present disclosure, when the protrusion is located near the restriction position, the distal end of the connection part is inclined in the radial direction and in a direction approaching the rotation axis with increasing distance from the second unit in the rotation direction.

According to the electronic device of the third aspect, when the first unit is brought into the closed state from the opened state while the first unit is in the opened state and the latch member is located at the restriction position instead of the release position, even if the latch member comes into contact with the first unit, the latch member is not pushed in the radial direction and is easily rotated toward the release position. As a result, breakage of latch member can be prevented.

In an electronic device according to a fourth aspect of the present disclosure, the second side surface is provided with a second groove portion that houses the protrusion when the latch member is located at the release position, the protrusion has a third inclined surface provided at an end close to the first unit in the rotation direction, and the third inclined surface is inclined in the second direction and in a direction approaching the second side surface with increasing distance from the first unit in the rotation direction.

According to the electronic device of the fourth aspect, when the latch member is located at the release position, the protrusion can be housed in the second groove portion. In addition, the latch member located at the release position can be more easily rotated toward the restriction position.

In an electronic device according to a fifth aspect of the present disclosure, the second groove portion has a fourth inclined surface provided at an end close to the first unit in the rotation direction, and the fourth inclined surface is inclined in the second direction and in a direction away from the second side surface with increasing distance from the first unit in the rotation direction.

According to the electronic device of the fifth aspect, the latch member located at the release position can be more easily rotated toward the restriction position.

In the electronic device according to a sixth aspect of the present disclosure, when the latch member is located at the restriction position, the protrusion is housed in the first groove portion while both ends of the protrusion in the radial direction are in contact with inner surfaces of the first groove portion.

According to the electronic device of the sixth aspect, it is possible to prevent the latch member from rotating beyond the restriction position.

Hereinafter, exemplary embodiments of the present disclosure will be described with reference to the accompanying drawings. In each drawing, elements are exaggerated in order to facilitate explanation.

In the present specification, a width direction of second unit 20 is an X-direction, a depth direction of second unit 20 is a Y-direction, and a thickness direction of second unit 20 is a Z-direction. The Y-direction is an example of a second direction in the present disclosure, and the Z-direction is an example of a first direction in the present disclosure.

As illustrated in FIG. 1, electronic device 1 is, for example, a notebook personal computer (laptop PC). Electronic device 1 includes first unit 10, second unit 20, and latch mechanism part 30 capable of retaining first unit 10 in a closed state with respect to second unit 20. In the closed state, first unit 10 forms an angle of substantially 0 degrees with respect to second unit 20. First unit 10 is detachably attached to second unit 20. That is, electronic device 1 is configured as a so-called detachable computer.

First unit 10 is, for example, a tablet computer. First unit 10 has a substantially rectangular plate shape, and includes first main surface 10a, second main surface 10b, and first side surface 10c. Second main surface 10b is disposed on a side opposite to first main surface 10a in the thickness direction (for example, in the Y-direction,) of first unit 10, and is provided with display 11. First side surface 10c intersects first main surface 10a and second main surface 10b. The display 11 is provided on second main surface 10b. As an example, display 11 is a touch panel capable of receiving touch operation by a user. First unit 10 incorporates a central processing unit (CPU), a volatile storage (RAM), a nonvolatile storage (ROM, SSD, or the like), a battery, and the like. The nonvolatile storage (ROM, SSD, or the like) stores an operating system (OS), various application programs, various data, and the like. The central processing unit (CPU) executes arithmetic processing by reading the OS, the application programs, and the various data, thereby realizing various functions.

As an example, second unit 20 is a station to which first unit 10 is detachably attached. Second unit 20 has a substantially rectangular plate shape, and includes third main surface 20a, fourth main surface 20b opposite to third main surface 20a in the Z-direction, and second side surface 20c intersecting third main surface 20a and fourth main surface 20b. Third main surface 20a is provided with input units 21 and 22 through which a user can perform input processing. Input units 21 and 22 include, for example, keyboard 21 and touch pad 22.

First unit 10 is attached to second unit 20 via hinges 23. Hinges 23 are disposed at an edge of second unit 20 in the Y-direction. Hinges 23 each have rotation axis parallel to the width direction of electronic device 1. Hinges 23 rotate first unit 10 about the rotation axis with respect to second unit 20.

Hinges 23 can retain first unit 10 at various angles with respective to second unit 20, for example. For example, as illustrated in FIG. 1, hinges 23 can retain first unit 10 at an angle of 90 degrees with respect to second unit 20. In this case, first unit 10 is in an opened state opened at an angle of 90 degrees with respect to second unit 20. Hinges 23 can retain first unit 10 in a closed state with respect to second unit 20. When first unit 10 is in the closed state, second main surface 10b and third main surface 20a are closely face each other, and first side surface 10c and second side surface 20c are disposed along the same plane.

Next, a configuration of latch mechanism part 30 will be described.

Figure 2:
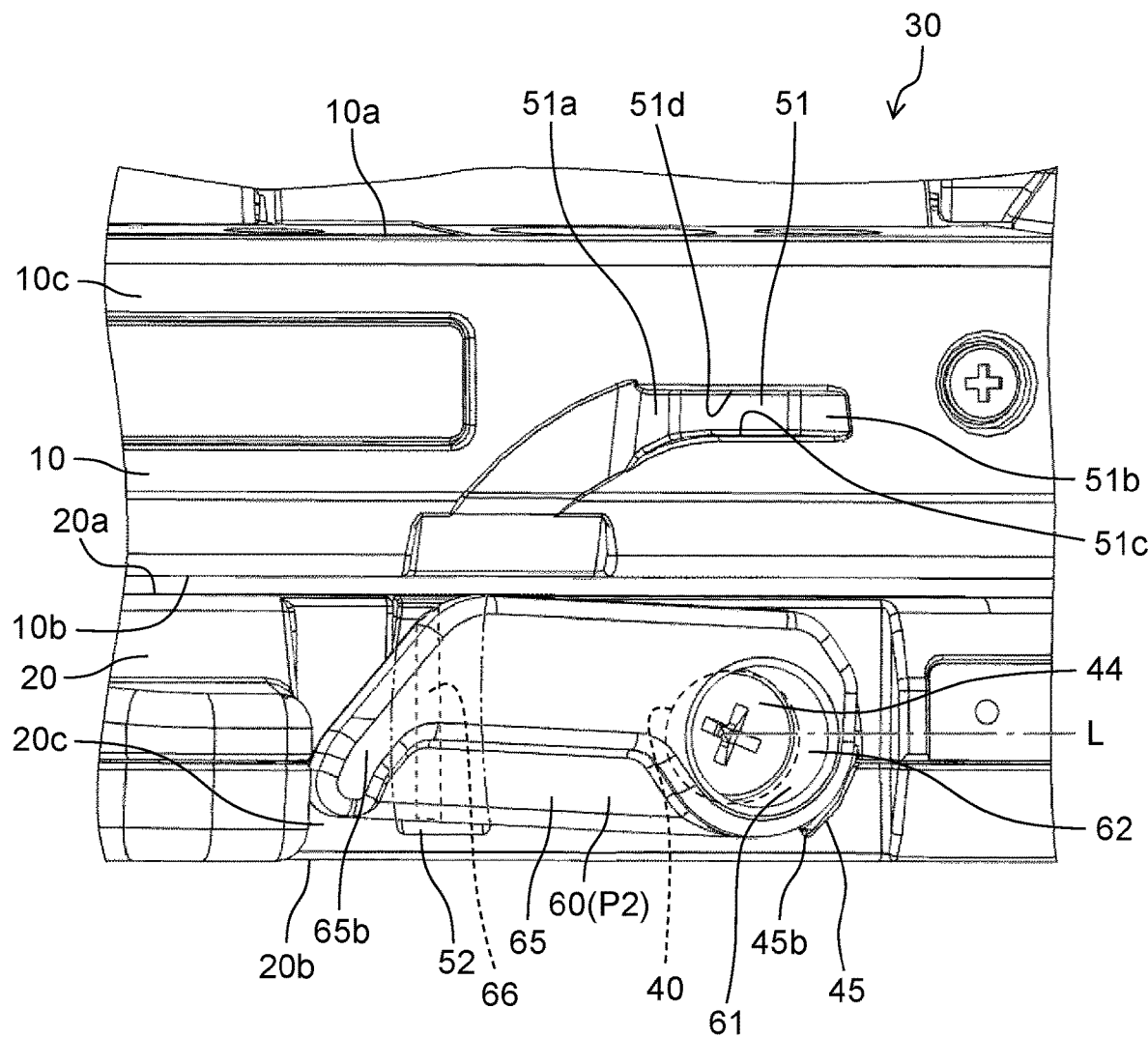
FIG. 2 is a partial perspective view illustrating the electronic device of FIG. 1 in a state where a latch member is located at a release position.
Figure 3:
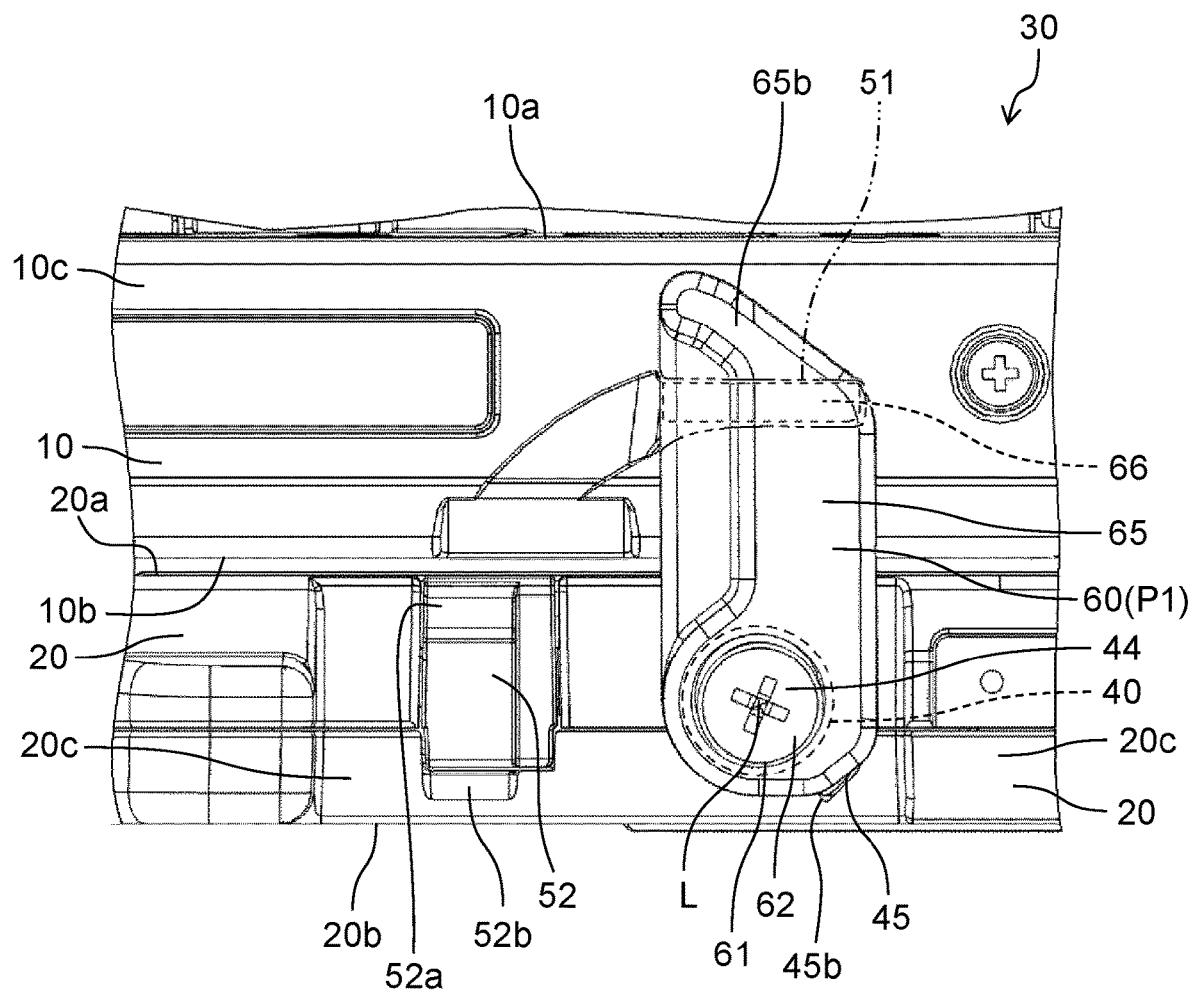
FIG. 3 is a partial front view illustrating the electronic device of FIG. 1 in a state where the latch member is located at a restriction position.
Figure 3:
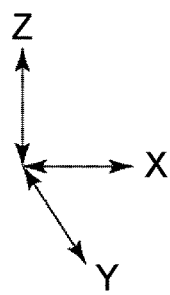

Latch mechanism part 30 includes housing recess 40, coil spring 43, first groove portion 51, and latch member 60. In the present exemplary embodiment, as illustrated in FIG. 1, housing recess 40 and latch member 60 are provided on second side surface 20c of second unit 20. Second side surface 20c constitutes a side surface distant from hinges 23 in the Y-direction among the side surfaces intersecting third main surface 20a and fourth main surface 20b of second unit 20. First groove portion 51 is provided on first side surface 10c of first unit 10. First side surface 10c constitutes a side surface distant from hinges 23 in the Y-direction among the side surfaces intersecting first main surface 10a and second main surface 10b of first unit 10. As illustrated in FIGS. 2 and 3, latch member 60 is configured to be rotatable about a rotation axis L extending along the Y-direction between restriction position P1 (see FIG. 3) and release position P2 (see FIG. 2).

Figure 4:
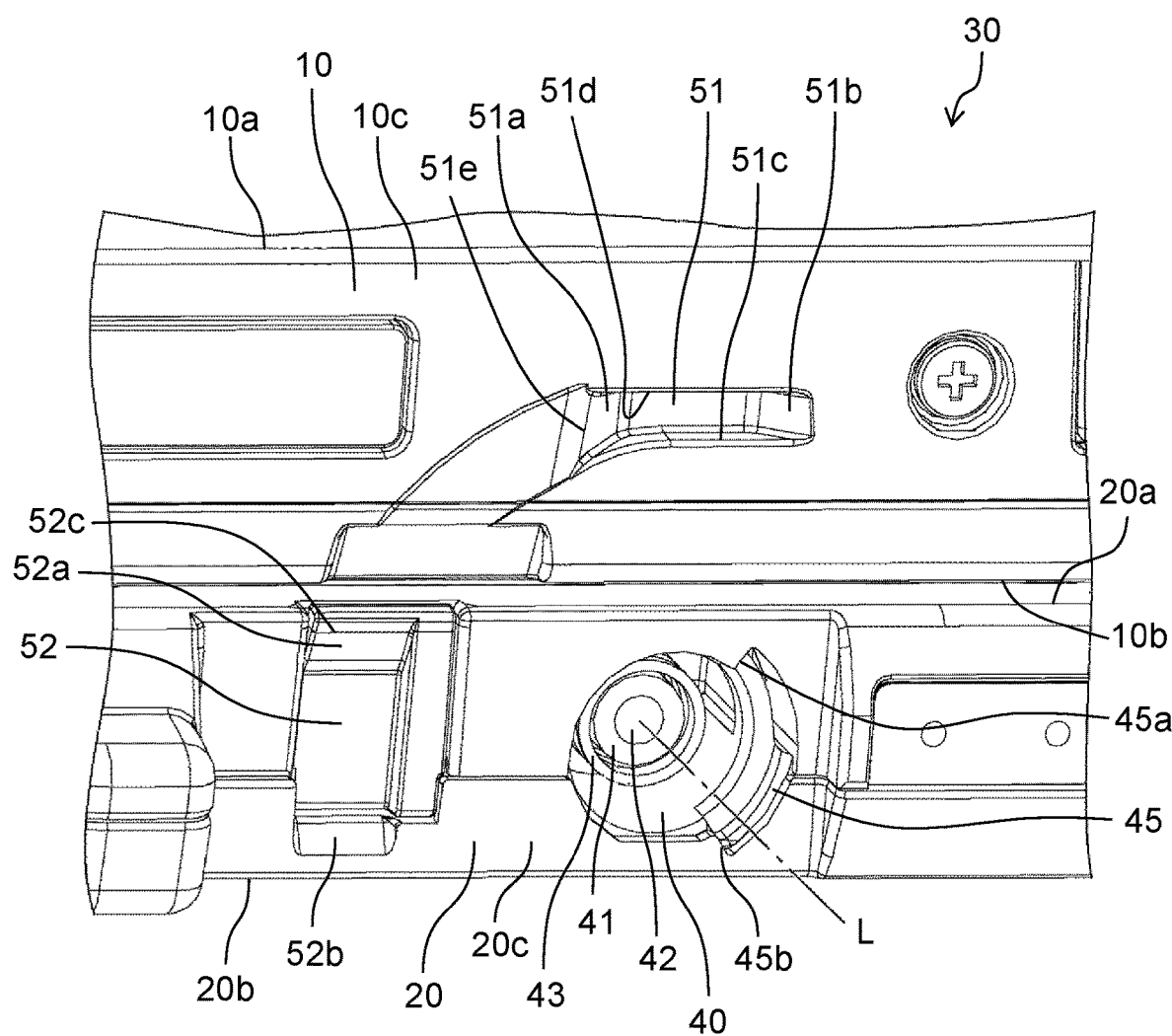
FIG. 4 is a partial perspective view illustrating the electronic device of FIG. 1 in a state where the latch member is removed.

As illustrated in FIG. 4, first groove portion 51 is provided on first side surface 10c of first unit 10, and is depressed from first side surface 10c toward the inside of first unit 10. When latch member 60 is located at restriction position P1, protrusion 66 of latch member 60 described later is housed in first groove portion 51. At this time, both ends of protrusion 66 in the radial direction are housed in a state of being in contact with first inner surface 51c and second inner surface 51d facing each other in the radial direction of first groove portion 51. First groove portion 51 has a substantially rectangular shape extending along the rotation direction (in the present exemplary embodiment, the X-direction) of latch member 60.

In the present exemplary embodiment, first groove portion 51 has second inclined surface 51a and fifth inclined surface 51b. A bottom surface extending in the X-direction along first side surface 10c is provided between second inclined surface 51a and fifth inclined surface 51b of first groove portion 51.

Second inclined surface 51a is provided at end 51e close to second unit 20 in the rotation direction of latch member 60. Second inclined surface 51a is inclined in the Y-direction and in the direction separating from first side surface 10c as advancing in the rotation direction of latch member 60 and in the direction away from second unit 20. Fifth inclined surface 51b is provided at an end close to first unit 10 in the rotation direction of latch member 60. Fifth inclined surface 51b is inclined in the Y-direction and in the direction away from first side surface 10c as advancing in the rotation direction of latch member 60 and in the direction away from first unit 10.

As illustrated in FIG. 4, housing recess 40 is depressed from second side surface 20c of second unit 20 toward the inside of second unit 20 in the Y-direction. Housing recess 40 has a substantially circular shape when viewed along the Y-direction, and houses shaft portion 61 of latch member 60 described later.

Inside housing recess 40, a substantially columnar shaft member 41 extending from the bottom surface of housing recess 40 in the Y-direction and in a direction approaching second side surface 20c is provided. An imaginary straight line passing through the center of shaft member 41 and extending in the Y-direction when viewed along the Y-direction constitutes the rotation axis L of latch member 60. A gap is provided around shaft member 41 with respect to the rotation axis L, and shaft member 41 is housed in recess 62 (described later) of shaft portion 61 via opening 63 of latch member 60 described later. Screw hole 42 to which screw 44 (see FIG. 2) is fastened is formed in an end surface of shaft member 41 close to second side surface 20c in the Y-direction. As illustrated in FIG. 2, latch member 60 is screwed to shaft member 41 via screw 44. Screw 44 has substantially circular head 44a when viewed along the Y-direction. Head 44a has a diameter larger than the outer diameter of coil spring 43.

As illustrated in FIG. 4, second side surface 20c is provided with restriction groove 45 and second groove portion 52.

Restriction groove 45 houses restriction member 64 of latch member 60 described later. Restriction groove 45 is disposed on second side surface 20c on the side opposite to second groove portion 52 to be described later with respect to the housing recess 40 and adjacent to housing recess 40, and is connected to housing recess 40. Restriction groove 45 has a substantially arc shape extending along the opening edge of housing recess 40, and has first end 45a on the first unit 10 side in the rotation direction (in other words, in the circumferential direction with respect to the rotation axis L,) of latch member 60 and second end 45b on second unit 20 side in the rotation direction of latch member 60. In the present exemplary embodiment, first groove portion 51 and restriction groove 45 restrict a rotation range of latch member 60.

Second groove portion 52 is depressed from second side surface 20c toward the inside of second unit 20 in the Y-direction. Second groove portion 52 is disposed at a position where first groove portion 51 is rotated about 90 degrees counterclockwise as viewed in the Y-direction and from first side surface 10c toward the inside of first unit 10. When latch member 60 is located at release position P2, protrusion 66 of latch member 60 is housed in second groove portion 52. Second groove portion 52 extends along the rotation direction (in the present exemplary embodiment, the Z-direction) of latch member 60.

In the present exemplary embodiment, second groove portion 52 has fourth inclined surface 52a and sixth inclined surface 52b. A bottom surface extending in the Z-direction along second side surface 20c is provided between fourth inclined surface 52a and sixth inclined surface 52b of second groove portion 52.

Fourth inclined surface 52a is provided at end 52c close to first unit 10 in the rotation direction of latch member 60. Fourth inclined surface 52a is inclined in the Y-direction and in the direction away from second side surface 20c with increasing distance from first unit 10 in the rotation direction of latch member 60. Sixth inclined surface 52b is provided at an end close to second unit 20 in the rotation direction of latch member 60. Sixth inclined surface 52b is inclined in the Y-direction and in the direction away from second side surface 20c as advancing in the rotation direction of latch member 60 and in the direction away from second unit 20.

Coil spring 43 is housed inside housing recess 40 and urges shaft portion 61 in the Y-direction and in the direction separating from connection part 65. Coil spring 43 is an example of an urging member in the present disclosure. Coil spring 43 is disposed in a gap around shaft member 41 with respect to the rotation axis L such that shaft member 41 penetrates the inside thereof.

Figure 5:
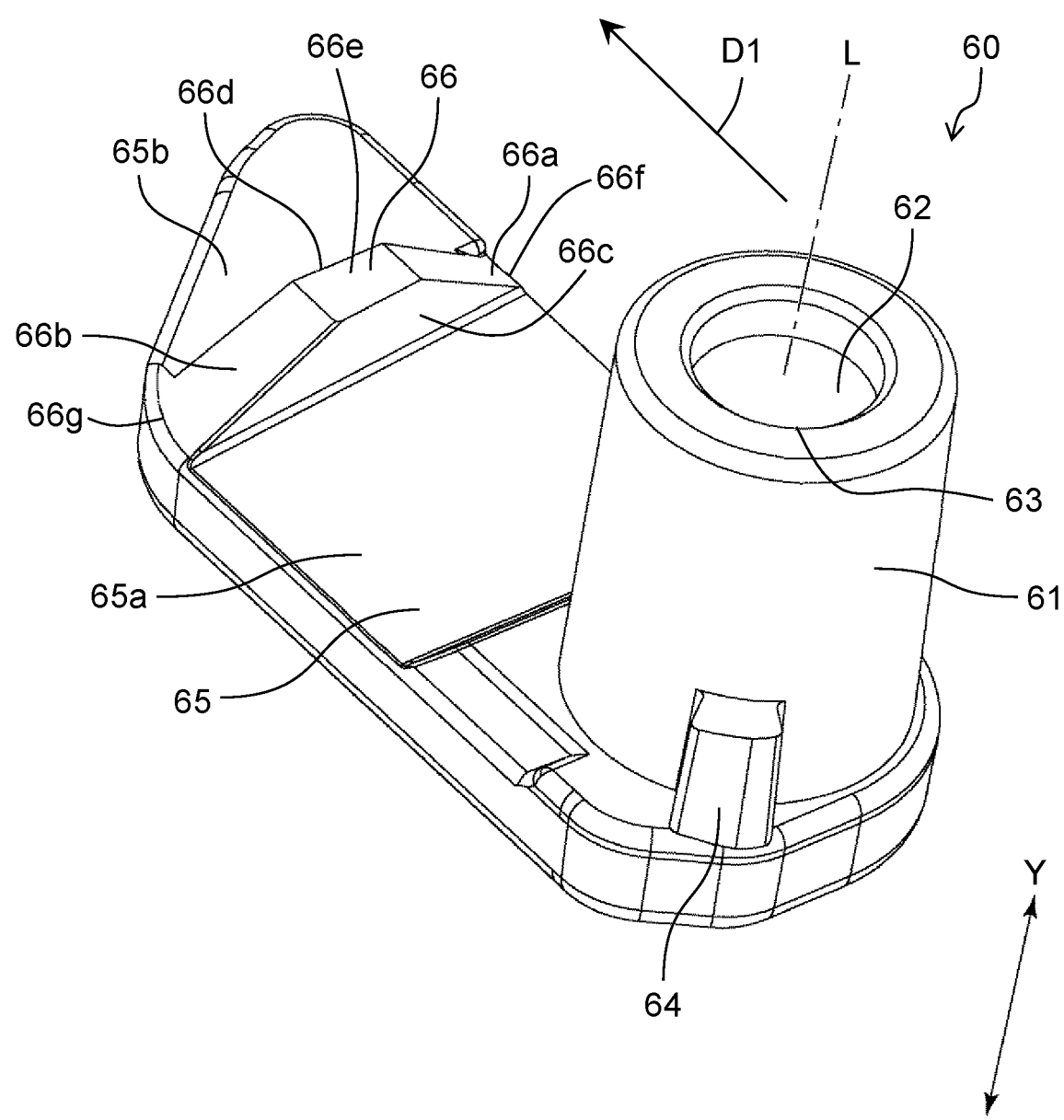
FIG. 5 is a perspective view illustrating the latch member of the electronic device of FIG. 1.

As illustrated in FIG. 5, latch member 60 includes shaft portion 61, connection part 65, and protrusion 66.

Shaft portion 61 has a cylindrical shape extending along the rotation axis L and is housed in housing recess 40 of second unit 20. Recess 62 having substantially circular opening 63 is provided on one end surface of shaft portion 61 in the Y-direction. Recess 62 is configured capable of housing shaft member 41. Opening 63 has a diameter smaller than the diameter of shaft member 41. Shaft member 41 is housed in recess 62 of shaft portion 61 through opening 63.

Shaft portion 61 has restriction member 64 protruding in the radial direction. In the present exemplary embodiment, restriction member 64 has a substantially rectangular parallelepiped shape extending along the rotation axis L, is disposed at an end of shaft portion 61 on the opposite side of recess 62 in the Y-direction, and is connected to connection part 65. When latch member 60 reaches release position P2 from restriction position P1, restriction member 64 comes into contact with first end 45*a* of restriction groove 45 of latch member 60 to prevent latch member 60 from further rotating beyond the release position P2. Furthermore, when latch member 60 reaches restriction position P1 from release position P2, restriction member 64 comes into contact with second end 45*b* of restriction groove 45 of latch member 60 to prevent latch member 60 from further rotating beyond the restriction position P1.

As an example, the connection part 65 has a substantially rectangular plate shape in which the radial direction D1 (see FIG. 5) of the rotation axis L is the longitudinal direction, and shaft portion 61 is connected to one end in the longitudinal direction. Here, the radial direction D1 of rotation axis L is a direction orthogonal to the rotation axis L. As illustrated in FIGS. 2 and 3, when protrusion 66 is located near restriction position P1, the distal end 65*b* distant from the rotation axis L in the radial direction of connection part 65 has a shape inclined in the radial direction and in a direction approaching the rotation axis L as advancing in the rotation direction of latch member 60 and in a direction away from second unit 20. Connection part 65 has facing surface 65*a* facing first side surface 10*c* and second side surface 20*c* in the Y-direction. When latch member 60 is located at restriction position P1, facing surface 65*a* faces first side surface 10*c* in the Y-direction, and when latch member 60 is located at the release position P2, facing surface 65*a* faces second side surface 20*c* in the Y-direction.

As illustrated in FIG. 5, latch member 60 includes protrusion 66 provided at distal end 65*b* of connection part 65. Protrusion 66 protrudes from facing surface 65*a* in the Y-direction toward first side surface 10*c* or second side surface 20*c*. In the present exemplary embodiment, protrusion 66 has a plate shape and extends along the rotation direction of latch member 60.

Protrusion 66 has first inclined surface 66*a* and third inclined surface 66*b* at both ends in the rotation direction of latch member 60. Furthermore, protrusion 66 has plane 66*e* located between first inclined surface 66*a* and third inclined surface 66*b*. Plane 66*e* is a plane parallel to facing surface 65*a* of connection part 65. That is, protrusion 66 has a substantially trapezoidal shape when viewed along the radial direction. First inclined surface 66*a* is provided at end 66*f* (an example of a first end) close to second unit 20 in the rotation direction of latch member 60. First inclined surface 66*a* is inclined in the Y-direction and in the direction away from facing surface 65*a* with increasing distance from second unit 20 in the rotation direction of latch member 60. Third inclined surface 66*b* is provided at end 66*g* (an example of a second end) close to first unit 10 in the rotation direction of latch member 60. Third inclined surface 66*b* is inclined in the Y-direction and in the direction away from facing surface 65*a* with increasing distance from first unit 10 in the rotation direction of latch member 60. As described above, since protrusion 66 has a substantially trapezoidal shape, latch member 60 can be smoothly rotated. As illustrated in FIG. 5, end 66*f* and end 66*g* of protrusion 66 are opposed to each other.

As an example, in a state where protrusion 66 is housed in first groove portion 51, first inclined surface 66*a* of protrusion 66 comes into contact with second inclined surface 51*a* of first groove portion 51, and third inclined surface 66*b* of protrusion 66 comes into contact with fifth inclined surface 51*b* of first groove portion 51. In a state where protrusion 66 is housed in second groove portion 52, first inclined surface 66*a* of protrusion 66 comes into contact with sixth inclined surface 52*b* of second groove portion 52, and third inclined surface 66*b* of protrusion 66 comes into contact with fourth inclined surface 52*a* of second groove portion 52.

Protrusion 66 has first outer surface 66*c* and second outer surface 66*d* extending in the Y-direction from facing surface 65*a* and in a direction of separating from facing surface 65*a*. First outer surface 66*c* is located closer to the rotation axis L than second outer surface 66*d* in the radial direction. In a state where protrusion 66 is housed in first groove portion 51, first outer surface 66*c* of protrusion 66 comes into contact with first inner surface 51*c* of first groove portion 51, and second outer surface 66*d* of protrusion 66 comes into contact with second inner surface 51*d* of first groove portion 51.

Next, an operation when first unit 10 is opened and closed with respect to second unit 20 will be described.

When latch member 60 is located at restriction position P1, as illustrated in FIG. 3, protrusion 66 is housed in first groove portion 51, and latch member 60 retains first unit 10 in the closed state with respect to second unit 20. When first unit 10 is brought into the opened state from the closed state with respect to second unit 20, firstly, latch member 60 located at restriction position P1 is rotated to the release position P2. Then, first unit 10 is rotated to form a desired angle with respect to second unit 20. When first unit 10 in the opened state is closed with respect to second unit 20, firstly, first unit 10 in the opened state is rotated with respect to second unit 20 to be in the closed state, contrary to the release operation described above. Then, latch member 60 located at release position P2 is rotated to the restriction position P1.

Electronic device 1 of the present exemplary embodiment can exhibit effects below.

Electronic device 1 includes first unit 10, second unit 20 to which first unit 10 is rotatably connected, and latch mechanism part 30 capable of retaining first unit 10 in a closed state with respect to second unit 20. Latch mechanism part 30 includes latch member 60, housing recess 40, coil spring 43, and first groove portion 51. Latch member 60 includes shaft portion 61 extending along the rotation axis L extending in the Y-direction, connection part 65 extending from shaft portion 61 in the radial direction with respect to the rotation axis L, and protrusion 66 provided at distal end 65*b* farther from shaft portion 61 in the radial direction of connection part 65. Latch member 60 is attached to second unit 20 in a state of being rotatable about the rotation axis L between restriction position P1 where protrusion 66 faces first side surface 10c in the Y-direction and release position P2 where protrusion 66 faces second side surface 20c in the Y-direction. Housing recess 40 is provided in second side surface 20c and houses shaft portion 61. Coil spring 43 is disposed in housing recess 40 and urges latch member 60 in the Y-direction and toward the inside of first unit 10. First groove portion 51 is provided on first side surface 10c, and houses protrusion 66 when latch member 60 is located at restriction position P1. Protrusion 66 has first inclined surface 66a provided at an end close to second unit 20 in the rotation direction of latch member 60 when latch member 60 is located at restriction position P1. First inclined surface 66a is inclined in the Y-direction and in a direction approaching first side surface 10c with increasing distance from second unit 20 in the rotation direction of latch member 60. With such a configuration, the retaining of the closed state of first unit 10 with respect to second unit 20 can be released only by rotating latch member 60 located at restriction position P1 toward release position P2. That is, when the retaining of the closed state of first unit 10 with respect to second unit 20 is released, protrusion 66 does not need to be moved in the Y-direction and in the direction against the urging. As a result, it is possible to realize electronic device 1 capable of more easily releasing the retaining of the closed state of first unit 10 with respect to second unit 20.

First groove portion 51 has second inclined surface 51a provided at an end close to second unit 20 in the rotation direction of latch member 60. Second inclined surface 51a is inclined in the Y-direction and in the direction away from first side surface 10c with increasing distance from second unit 20 in the rotation direction of latch member 60. With such a configuration, latch member 60 located at restriction position P1 can be easily rotated toward release position P2.

When protrusion 66 is located near restriction position P1, distal end 65b of connection part 65 is inclined in the radial direction and in a direction approaching the rotation axis L with increasing distance from second unit 20 in the rotation direction of latch member 60. With such a configuration, when first unit 10 is brought into the closed state from the opened state while first unit 10 is in the opened state and latch member 60 is located at restriction position P1 instead of release position P2, even if latch member 60 comes into contact with first unit 10, latch member 60 is not pushed in the radial direction, but is easily rotated toward release position P2. As a result, breakage of latch member 60 can be prevented.

Second side surface 20c is provided with second groove portion 52 that houses protrusion 66 when latch member 60 is located at release position P2. Protrusion 66 has third inclined surface 66b provided at an end close to first unit 10 in the rotation direction of latch member 60. Third inclined surface 66b is inclined in the Y-direction and in a direction approaching second side surface 20c with increasing distance from first unit 10 in the rotation direction of latch member 60. With such a configuration, when latch member 60 is located at release position P2, protrusion 66 can be housed in second groove portion 52. Furthermore, latch member 60 located at release position P2 can be more easily rotated toward restriction position P1.

Second groove portion 52 has fourth inclined surface 52a provided at an end close to first unit 10 in the rotation direction of latch member 60. Fourth inclined surface 52a is inclined in the Y-direction and in the direction away from second side surface 20c with increasing distance from first unit 10 in the rotation direction of latch member 60. With such a configuration, latch member 60 located at release position P2 can be more easily rotated toward restriction position P1.

When latch member 60 is located at restriction position P1, protrusion 66 is housed in first groove portion 51 in a state where first outer surface 66c and second outer surface 66d of protrusion 66 are in contact with first inner surface 51c and second inner surface 51d of first groove portion 51. With such a configuration, it is possible to prevent latch member 60 from rotating beyond restriction position P1.

Note that first groove portion 51 may have any shape and configuration capable of housing protrusion 66. For example, in the present exemplary embodiment, an example in which first groove portion 51 has second inclined surface 51a and fifth inclined surface 51b has been described, but the present invention is not limited thereto. For example, one or both of second inclined surface 51a and fifth inclined surface 51b may be omitted.

Protrusion 66 is not limited to have third inclined surface 66b, and third inclined surface 66b may be omitted. Furthermore, a gap may be formed between both ends of protrusion 66 in the radial direction and inner surface of first groove portion 51.

Latch mechanism part 30 is not limited to the case of being provided on first side surface 10c of first unit 10 and second side surface 20c of second unit 20. Latch mechanism part 30 may be provided on any side surface disposed along the same plane of first unit 10 and second unit 20.

First unit 10 may be a station and second unit 20 may be a tablet.

In the present exemplary embodiment, when protrusion 66 is located near restriction position P1, distal end 65b of connection part 65 is inclined in the radial direction and in a direction approaching the rotation axis L with increasing distance from second unit 20 in the rotation direction of latch member 60. However, distal end 65b may not be inclined as described above.

In the present exemplary embodiment, an example in which second groove portion 52 is provided on second side surface 20c has been described, but the present invention is not limited thereto. For example, second groove portion 52 may be omitted.

The urging member is not limited to coil spring 43, and another configuration capable of urging latch member 60 in the Y-direction toward the inside of second unit 20 can be adopted.

Second groove portion 52 is not limited to the case of including fourth inclined surface 52a and sixth inclined surface 52b, and one or both of fourth inclined surface 52a and sixth inclined surface 52b may be omitted.

Although the present disclosure has been fully described in connection with preferable exemplary embodiments with reference to the accompanying drawings, various modifications and changes are obvious to those skilled in the art. It is to be understood that such modifications and changes are included within the scope of the present disclosure according to the appended claims unless such modifications and changes depart from the scope of the present disclosure.

INDUSTRIAL APPLICABILITY

The present disclosure is useful for an electronic device in which a first unit and a second unit are detachably connected.

REFERENCE MARKS IN THE DRAWINGS 1 electronic device
10 first unit 10a first main surface
10b second main surface
10c first side surface
20 second unit
20a third main surface
20b fourth main surface
20c second side surface
30 latch mechanism part
40 housing recess
43 coil spring
51 first groove portion
51a second inclined surface
51c first inner surface
51d second inner surface
52 second groove portion
52a fourth inclined surface
60 latch member
61 shaft portion
65 connection part
65b distal end
66 protrusion
66a first inclined surface
66b third inclined surface

The invention claimed is:

1. An electronic device comprising:
a first unit having a first main surface, a second main surface opposite to the first main surface in a direction intersecting the first main surface, and a first side surface intersecting the first main surface and the second main surface;
a second unit having a third main surface, a fourth main surface opposite to the third main surface in a first direction intersecting the third main surface, and a second side surface intersecting the third main surface and the fourth main surface, the first unit being rotatably connected to the second unit, and the second side surface being disposed along the same plane as the first side surface in a closed state where the second main surface and the third main surface approach and face each other in the first direction; and
a latch mechanism part configured to retain the first unit in the closed state with respect to the second unit;
wherein
the latch mechanism part includes:
a latch member including:
a shaft portion extending along a rotation axis extending in a second direction intersecting the second side surface,
a connection part extending from the shaft portion in a radial direction of the rotation axis, and
a protrusion provided at a distal end of the connection part on a side farther from the shaft portion in the radial direction, the latch member being attached to the second unit in a state where the protrusion is rotatable about the rotation axis between a restriction position where the protrusion faces the first side surface in the second direction and a release position where the protrusion faces the second side surface in the second direction,
a housing recess that is provided on the second side surface and houses the shaft portion,
an urging member that is disposed in the housing recess and urges the latch member toward an inside of the first unit, and
a first groove portion that is provided on the first side surface and houses the protrusion when the latch member is located at the restriction position,
the protrusion has a first inclined surface provided at a first end close to the second unit in a rotation direction of the latch member when the latch member is located at the restriction position, and
the first inclined surface is inclined in a direction approaching the first side surface with increasing distance from the second unit in the rotation direction.

2. The electronic device according to claim 1, wherein
the first groove portion includes a second inclined surface provided at an end close to the second unit in the rotation direction, and
the second inclined surface is inclined in a direction away from the first side surface with increasing distance from the second unit in the rotation direction.

3. The electronic device according to claim 1, wherein when the protrusion is located near the restriction position, the distal end of the connection part is inclined in a direction approaching the rotation axis with increasing distance from the second unit in the rotation direction.

4. The electronic device according to claim 1, wherein
the second side surface includes a second groove portion that houses the protrusion when the latch member is located at the release position,
the protrusion includes a third inclined surface provided at a second end close to the first unit in the rotation direction, and
the third inclined surface is inclined in a direction approaching the second side surface with increasing distance from the first unit in the rotation direction.

5. The electronic device according to claim 4, wherein
the second groove portion includes a fourth inclined surface provided at an end close to the first unit in the rotation direction, and
the fourth inclined surface is inclined in a direction away from the second side surface with increasing distance from the first unit in the rotation direction.

6. The electronic device according to claim 4, wherein the protrusion is located between the first inclined surface and the third inclined surface, and includes a plane parallel to a surface of the connection part.

7. The electronic device according to claim 1, wherein
the protrusion includes two outer surfaces facing each other in the radial direction, and
when the latch member is located at the restriction position, the protrusion is housed in the first groove portion while the two outer surfaces are in contact with two inner surfaces of the first groove portion.

* * * * *